United States Patent [19]
Hampden-Smith et al.

[11] Patent Number: 5,894,064
[45] Date of Patent: *Apr. 13, 1999

[54] SOLUTION ROUTES TO METAL OXIDE FILMS THROUGH ESTER ELIMINATION REACTIONS

[76] Inventors: Mark Hampden-Smith, 2901 Maximillian N.W., Albuquerque, N.M. 87104; James Caruso, 13929 Lima Pl. N.E., Albuquerque, N.M. 87122; Clive Chandler, 618 Parkland Cir. S.E., Albuquerque, N.M. 87108

[*] Notice: This patent is subject to a terminal disclaimer.

[21] Appl. No.: 08/402,584

[22] Filed: Mar. 13, 1995

[51] Int. Cl.$^6$ .......................... H01L 21/00; C23C 16/40
[52] U.S. Cl. .................. 438/3; 438/778; 438/781; 427/126.3; 427/226; 427/255.3; 427/376.2
[58] Field of Search .................. 437/235, 243; 427/126.3, 226, 255.3, 376.2; 438/778, 781, 3

[56] References Cited

U.S. PATENT DOCUMENTS

| | | | |
|---|---|---|---|
| 4,880,770 | 11/1989 | Mir et al. | 505/1 |
| 4,962,088 | 10/1990 | Micheli et al. | 505/1 |
| 4,983,577 | 1/1991 | Mantese et al. | 505/1 |
| 5,021,398 | 6/1991 | Sharma et al. | 505/1 |
| 5,064,684 | 11/1991 | Mir et al. | 427/53.1 |
| 5,217,754 | 6/1993 | Santiago-Aviles et al. | 427/226 |
| 5,225,561 | 7/1993 | Kirlin et al. | 546/256 |
| 5,277,789 | 1/1994 | Kounaves et al. | 205/238 |
| 5,280,012 | 1/1994 | Kirlin et al. | 505/1 |
| 5,316,579 | 5/1994 | McMillan et al. | 118/50 |
| 5,343,353 | 8/1994 | Miki | 361/322 |
| 5,389,456 | 2/1995 | Singh et al. | 429/27 |
| 5,391,393 | 2/1995 | Maniar | 427/100 |
| 5,456,945 | 10/1995 | McMillan et al. | 427/252 |
| 5,514,822 | 5/1996 | Scott et al. | 556/28 |
| 5,656,329 | 8/1997 | Hampden-Smith et al. | 427/226 |

FOREIGN PATENT DOCUMENTS 1-246109  1/1989  Japan.

OTHER PUBLICATIONS

"Preparation of Ferroelectric BaTiO$_3$ Thin Films by Metal Organic Chemical Vapour Deposition", C. H. Lee, et al., Department of Inorganic Materials Engineering, Seoul National University, Korea, 219–224.

"Chemical Aspects of Solution Routes to Perovskite–Metal Oxides from Phase–Mixed–Metal Organic Precursors", Clive D. Chandler, et al., American Chemical Society, Chemical Reviews, vol. 93, No. 3, 1205–1241.

Combustion Chemical Vapor Deposition: A Novel Thin–Film Deposition Technique, A. T. Hunt, et al., American Institute of Physics, Appl. Phys. Lett. 63(2), Jul. 12,'93, 266–268.

Primary Examiner—Charles Bowers
Assistant Examiner—Matthew Whipple
Attorney, Agent, or Firm—David Denker; Robby T. Holland; Richard L. Donaldson

[57] ABSTRACT

A method of forming a thin film of a metal oxide on a substrate by coating the substrate with a solution comprising metal-organic precursors is disclosed. This method is applicable to, e.g., forming thin films of perovskite-phase titanates, zirconates, and/or niobates of divalent metals such as Ba, Sr, Pb and/or Ca. In one embodiment, a first precursor comprises a divalent metal coordinated to one or more organic ligands, and a second precursor comprises a tetravalent metal coordinated to one or more organic ligands are supplied in a common solution. A substrate 14 is coated with this solution (e.g. by spin coating) to form a preliminary thin film 10. Substrate heater 22 preferably heats substrate 14 to a temperature sufficient to react ligands from the first and second precursors in an ester elimination reaction which forms a volatile precursor 16. This reaction leaves an intermediate compound film 12 comprising the divalent metal and the tetravalent metal on the substrate. The substrate may be subsequently annealed to drive off unreacted ligands and/or fully crystallize the intermediate compound film into a perovskite-phase film 18.

21 Claims, 1 Drawing Sheet

SOLUTION ROUTES TO METAL OXIDE FILMS THROUGH ESTER ELIMINATION REACTIONS

LICENSE RIGHTS

The U.S. Government may have specific rights regarding this invention as provided for in the terms of Contract #F49620-93-1-0197 awarded by the Air Force Office of Scientific Research.

FIELD OF THE INVENTION

This invention relates to solution routes to metal oxide films, and more particularly to solution routes to perovskite-phase mixed-metal oxide films using organo-metallic precursors and/or metalorganic precursors.

BACKGROUND OF THE INVENTION

Perovskite-phase mixed-metal oxide materials with the general formula $ABO_3$ may possess one or more interesting and useful electrical properties, due to the existence of polar space groups within the perovskite-phase crystals. For example, perovskites may be ferroelectric materials, which have the ability to permanently retain an electric dipole after orientation in an electric field. Perovskites may also have a pyroelectric behavior, which is exhibited by a high dependence of dielectric constant on crystal temperature. Perovskites are often piezoelectric crystals, which exhibit a charge when mechanically stressed and mechanically deform when an electric field is applied. Finally, many perovskites may be operated in a linear electric field range where they exhibit extremely high dielectric constant (generally greater than 200). As such, perovskites find application, e.g., in DRAMs, capacitors, ferroelectric devices (e.g. FRAMs), infrared detectors, and piezoelectric transducers.

The formation of perovskite-phase mixed-metal oxides as thin films (i.e. less than 5 μm in thickness) on the surface of a semiconductor substrate presents particular problems. To utilize such a film for one or more of the properties listed above, the film must generally be deposited with exacting stoichiometry, high homogeneity and purity, and a controlled grain size, or the desired property may be largely non-existent. Bulk ceramic manufacture of perovskites generally meets these constraints using high temperature (typically over 1000° C.) processes which are generally unacceptable for the manufacture of microelectronic device thin films. Methods of forming some perovskites in thin film form from a solution of metal-organic precursors have been developed, although these typically require annealing temperatures in excess of 600° C. in order to densify, remove impurities from, and/or fully crystallize a film. Perovskite thin film deposition processes which can be used at temperatures generally less than 500° C. to deposit high quality films are desired for the manufacture of microelectronic devices.

SUMMARY OF THE INVENTION

The present invention provides solution routes for deposition of thin films of perovskite-phase mixed-metal oxides. This invention is particularly applicable to low-temperature depositions, controlled stoichiometry depositions and/or depositions requiring high purity and homogeneity.

It is possible to create metal-organic precursors having carboxylate-like ligands, which may be defined generally as $O_2CR$, where R is preferably an alkyl, aryl, substituted alkyl or aryl, or halogenated hydrocarbon substituent. Such precursors are economical, may react, e.g. with alkoxides, to form esters, and have now been found to have improved solubility and resist oligomerization in solution in some instances. Unfortunately, metal-organic precursors having carboxylate-like ligands typically thermally decompose to form undesirable stable products, such as metal carbonates and/or fluorides. For example, barium acetate thermally decomposes between 400° C. and 600° C. to form barium carbonate, which is generally stable to a temperature of 750° C. to 900° C. This stability presents a difficulty for applications such as microcircuits; high temperatures which would typically damage such microcircuits are required to remove carbon impurities incorporated into such a film. As such, precursors having carboxylate-like ligands have not been considered good candidates for metal oxide film formation in microcircuit applications. However, a method which uses carboxylate-like precursors has now been found which avoids the formation of carbonates/fluorides. This is apparently the first perovskite-phase mixed-metal oxide thin film from a solution coating technique to succesfully use metal-organic precursors having carboxylate-like ligands in a low-temperature deposition process, without formation of a metal carbonate and/or fluoride phase within the film. In addition, this technique generally does not liberate water during reaction or require gelation with water.

It has now been found that a thin film may be formed by coating a substrate with a solution comprising two or more metal-organic precursors which react with each other to form volatile esters and desired solid-phase components upon heating of the substrate. For example, a carboxylate or carboxylate-like ligand coordinated to a first metal atom and an alkoxyl ligand coordinated to a second metal atom may participate in an ester elimination reaction. This reaction advantageously removes a carboxylate ligand from the film, eliminating a potential source of metal carbonate. It Is also believed that the same ester elimination reaction may leave the first metal atom bonded to the second metal atom through an oxygen atom. If substantially all carboxylate-like ligands are removed via ester elimination, this is believed to dictate the evolution of structure on formation of the final mixed-metal oxide, thus improving the homogeneity of and thereby lowering processing temperatures for the final film.

In one aspect, the present invention relates to a method of depositing a thin film on a semiconductor substrate. This method comprises supplying a dehydrated solution comprising first and second precursors (preferably in a solvent), the first precursor having a general formula AX and the second precursor having a general formula BY. A is a metal preferably selected from the group consisting of barium, strontium, calcium, bismuth, and combinations thereof. Lead may also be included in this group; lead is generally easier to deposit at low temperatures than other members of this group, but is generally not preferred for semiconductor applications. B is a metal preferably selected from the group consisting of titanium, niobium, zirconium, and combinations thereof. Furthermore, X comprises at least one first organic ligand coordinated to A having an empirical formula $O_2CR$, wherein R is preferably an alkyl, aryl, substituted alkyl or aryl, or halogenated hydrocarbon constituent. Y comprises at least one second organic ligand coordinated to B having an empirical formula OR', wherein R' is an organic substituent. This method further comprises coating the substrate with this solution to form a thin film. This method may further comprise evaporating the solvent from this film. This method further comprises heating the substrate to a temperature sufficient to produce an ester elimination reaction between the first and second precursors on the substrate.

This ester elimination reaction preferably reacts substantially all first organic ligands with second organic ligands to form volatile esters, thereby depositing an intermediate compound film comprising A, B, and O on the substrate.

This method may further comprise annealing the intermediate compound film at a predetermined temperature (preferably less than 500° C.) such that substantially all remaining Y ligands are vaporized, and/or such that the intermediate compound film is transformed into a polycrystalline film having an empirical formula $ABO_3$ (e.g. a perovskite). Annealing may be carried out in an oxidizing atmosphere. In any case, it may be possible to anneal and perform ester elimination at the same temperature.

A cyclic or acyclic multidentate organic coordinating compound, such as the cyclic polyethers 18-crown-6 and 15-crown-5 and acyclic polyether teraglyme, may be coordinated to A to prevent oligomerization of the first precursor and/or enhance its solubility. BY may comprise an alkoxide, preferably $Ti(O^iPr)_4$ (i.e. tetraisopropyl titanate, or TPT). Alternately, BY may comprise a metal B coordinated to two or more ligands selected from the group consisting of alkoxyls, β-diketonates, β-ketoiminates, and Schiff bases (e.g. $Ti(O^iPr)_2(acac)_2$).

In another aspect of the invention, a method of forming a thin film of insulating material on a semiconductor substrate from a liquid containing suitable precursors is disclosed, wherein the insulating material has an empirical formula $ABO_3$ and A and B are selected as described above. This method comprises supplying a dehydrated solution comprising first and second precursors in a molar ratio required to form the desired final metal oxide phase (preferably substantially 1:1). The first precursor has a formula $A(O_2CR)_2 \cdot L$ and the second precursor has a formula $BR'_xR''_{a-x}$, where:

R is a first organic substituent selected from the group consisting of alkyl, aryl, substituted alkyl or aryl, and halogenated hydrocarbon constituents;

L is a multidentate ligand coordinated to A;

R' is an alkoxyl organic substituent;

R" is a third organic substituent selected from the group consisting of alkoxyls, β-diketonates, β-ketoiminates, Schiff bases, and combinations thereof; and x has a value selected between 1 and α, inclusive.

This method further comprises coating the substrate with this solution to form a thin film, and drying the film to remove solvents. This method further comprises heating the substrate to a temperature sufficient to produce an ester elimination reaction between the first and second precursors, preferably reacting substantially all $O_2CR$ ligands to form a volatile ester and forming an intermediate compound film comprising A, B, and O on the substrate. This method may further comprise annealing the intermediate compound film in an oxygen-containing atmosphere, thereby converting the intermediate compound film into a film of insulating material.

BRIEF DESCRIPTION OF THE DRAWINGS

This invention, including various features and advantages thereof, can be best understood by reference to the following drawing, wherein.

DETAILED DESCRIPTION OF THE PREFERRED EMBODIMENTS

The present invention includes a general method for depositing thin films on a semiconductor substrate, which is described herein with reference to several specific embodiments. This method is also believed to be applicable to deposition of a simple metal oxide (e.g. $TiO_2$), by using the same metal in both AX and BY precursors, or to deposition of other mixed-metal oxides with a wide variety of valences for A and B.

Thin films may be formed from a solution of appropriate precursors by first coating a substrate surface with a liquid solution, e.g. by dipping a substrate into a solution, spraying a solution onto a substrate surface, or by a spin-on technique, wherein a drop of solution is placed in the center of a substrate and the substrate is spun to distribute the solution across the substrate surface. Once coated onto a substrate, such a thin film may be dried to remove solvents, heated to react and decompose precursors, and/or heated to anneal the film for the purpose of driving out impurities, densification and/or crystallization. In a given system, these steps may be conducted at different substrate temperatures, under different atmospheres, using a gradually rising temperature, or simply as a single step which accomplishes all purposes.

Figure 1:
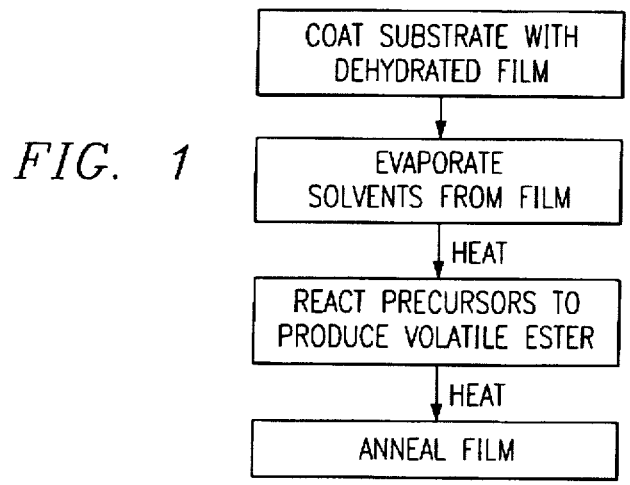
FIG. 1 shows a general flow diagram of a process according to the present invention and FIGS. 2A–2C show a semiconductor substrate at various stages of film deposition.
Figure 2A:
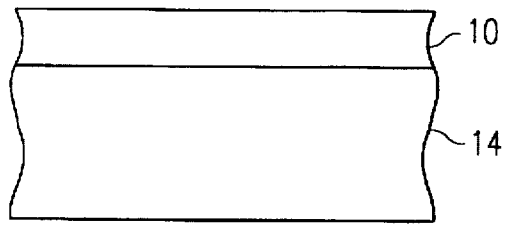
Figure 2B:
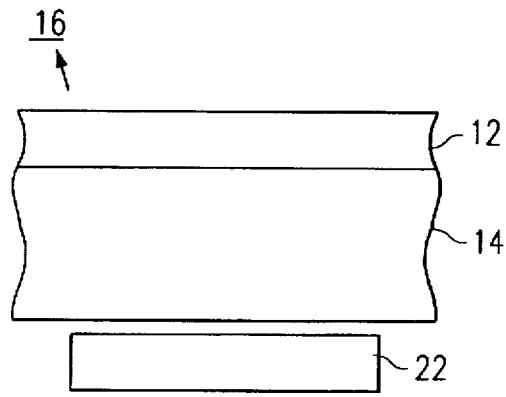
Figure 2C:
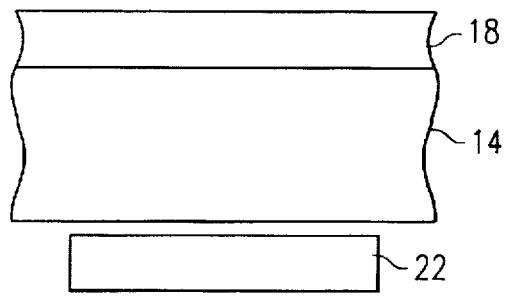

FIG. 1 shows one way in which steps may be combined in the present invention to produce a metal oxide film. FIG. 2A shows a semiconductor substrate 14, after a solution containing a mixture of precursors has been applied to form a thin film 10 on 14. FIG. 2B shows substrate 14 resting on a substrate heater 22. Such a heater may be used to heat substrate 14 in a controlled fashion and thereby induce ester elimination reactions in the present invention. These reactions are preferably controlled by heating substrate 14 (preferably to a temperature less than that which would decompose the organic supporting ligands of either of the precursors, although higher temperatures may be used in some embodiments) such that volatile esters 16 are created and removed from the film, and an intermediate film 12 which comprises metals, oxygen, and possibly some additional ligands not used in the ester elimination reaction remains. FIG. 2C shows substrate 14 after further heating to convert intermediate film 12 to a metal oxide film 18. This annealing step is preferably accomplished by raising the substrate temperature above that required for ester formation, preferably in an oxygen-containing atmosphere, to produce a film of an insulating material (preferably a perovskite-phase titanate, niobate, and/or zirconate film).

Metal-organic precursors are commonly used for deposition of thin films. Substitution of one or more of the alkoxide ligands on one or more of the metal precursors by a carboxylate functionality has been used as a method of formation of perovskite-phase materials from solution. This typically involves a sol-gel process in which metal alkoxides and metal carboxylates are combined, water is added, and the sol is gelled in thin film form. Typically, residual carbon and hydroxyl groups remain in the film after drying, such that the film must then be annealed at 600° C. or higher to remove these constituents and densify the film. High temperatures have generally been required in any case to crystallize materials containing barium, for example, at least partially because of the difficulty in obtaining homogeneous films from barium precursors.

A new process for obtaining metal oxide thin films from solutions containing metal-organic precursors having carboxylate ligands has now been found. This method may employ metal-organic precursors having carboxylate and alkoxide ligands, but differs from prior art processes in several areas in addition to not employing individual precursor decomposition as a primary reaction mechanism. Carboxylated precursors preferred in the present invention are adducts of metal carboxylates, specifically designed to prevent oligomerization of the precursor. This has been found to enhance the solubility of the precursor and/or provide greater homogeneity in solution. Precursors and the solution itself are substantially dehydrated in the present invention, such that hydrolysis reaction routes are avoided. Precursors in the present invention are designed and combined such that substantially all carboxylate or carboxylate-like ligands participate in ester elimination reactions which liberate volatile esters. It is now believed that such reactions may be used to dictate structure in the final film; e.g., a mechanism for placing a carboxylate functionality on one metal atom an alkoxide functionality on a second metal atom, and reacting the two to create a bridging oxygen ligand between the two metal centers, is believed to be useful in depositing a homogeneous film which does not require extensive metal diffusion to create a perovskite-phase film.

One combination of precursors applicable to ester elimination is a metal formate first precursor and a metal alkoxide second precursor. As first precursors, Pb, Ca, Sr, and Ba formates have been prepared similar to the following example. As a typical second precursor, $Ti(O^iPr)_4$ is available from commercial sources. In a first experiment, a liquid precursor mixture was prepared by the following steps. Lead carbonate was reacted with $HO_2CH$ to produce $Pb(O_2CH)_2$. 1.56 g of finely ground $Pb(O_2CH)_2$ was suspended in 100 mL of ethanol and heated to 60° C. 1.49 g of $Ti(O^iPr)_4$ was dissolved in 40 mL of ethanol and added to this suspension and stirred (the lead suspension should be dehydrated since tetraisopropyl titanate reacts with water). The suspension was heated until all of the $Pb(O_2CH)_2$ was dissolved to form the liquid precursor mixture. Ethanol was allowed to evaporate from the precursor mixture. When approximately 70 ml remained, a precipitate began to form and 0.1 ml of triethanolamine was added as a stabilizer. The volume was then further reduced to 30 ml, giving the equivalent of a 5 weight percent lead titanate solution. This precursor mixture was spin-coated onto substrates and annealed at temperatures from 150° C. to 700° C. in 50° C. increments. At 300° C. and above, a polycrystalline lead titanate was formed.

The metal formate and metal ethoxide precursor mixtures as described above may be suitable for forming thin films in some applications. However, it may be preferable to modify a precursor by reaction with a cyclic or acyclic multidentate organic coordinating compound to achieve higher quality films at lower temperatures. For example, $Ba(O_2CCH_3)_2 \cdot 18$-crown-6 was prepared by first dissolving 1.7472 g of 18-crown-6 in approximately 25 mL of $H_2O$. 1.6884 g of $Ba(O_2CCH_3)_2$ was added with approximately 25 mL of additional $H_2O$ and the solution was stirred. Dehydrating a carboxylated precursor is usually necessary; otherwise, the water of hydration of the carboxylated precursor may react with an alkoxide precursor when the two precursors are combined. The solution was heated to evaporate $H_2O$ until about 15 mL remained, after which the remaining $H_2O$ was removed under vacuum. The remaining precursor material was verified to be $Ba(O_2CCH_3)_2 \cdot 18$-crown-6. It is believed that such a compound consumes the available Ba coordination sites, thus preventing oligomerization of the precursor in solution.

In a second example, 0.3612 g of a first precursor $Ba(O_2CCH_3)_2(18\text{-crown-6})$ prepared as described above was added to 0.1976 g of a second precursor $Ti(O^iPr)_4$, and 1 mL of dry ethanol was added. A colloid was formed by subjecting this liquid precursor mixture to ultrasonic radiation until both precursors were thoroughly mixed. A silicon wafer was spun at 3000 rpm while 1 drop of the solution was placed in its center. The wafer was heated for 15 minutes at 700° C. The wafer was cooled, and spun again while 5 more drops of the solution were placed on it. The wafer was subsequently heated in a tube furnace for 2 hours at 700° C. Glancing angle x-ray diffraction showed the film to be crystalline $BaTiO_3$, and contained no measurable $BaCO_3$.

Precursors such as barium acetate readily thermally decompose to form barium carbonate. In the film described above, barium carbonate was not found, indicating that ester elimination, not thermal decomposition, is believed to be the primary reaction mechanism involved in the deposition. It is also believed that this reaction controls stoichiometry and homogeneity of the deposited film.

As an alternative, more than one type of organic constituent or ligand may be attached to a metal atom to form BY. For example, if B is a tetravalent, BY could have the general form $B(OR')_{4-x}(R")_x$, where $x=1, 2, 3,$ or 4 and OR' ligands are used in the ester elimination reactions. R" ligands may comprise other ligands such as other alkoxyls, β-diketonates, β-ketoiminates, or Schiff bases. In such a precursor, x preferably would be chosen to provide an OR' ligand to react with each X ligand of the AX compound (e.g. for A=Ba and B=Ti, preferably x=2). An example of such a precursor is $Ti(O^iPr)_2(acac)_2$.

Typically, the molar ratio of, e.g., divalent metal A to tetravalent metal B, is tightly controlled and near 1:1 for many perovskite-phase metal oxides. However, it has been found that, e.g. if B is titanium, the electrical properties of a final dielectric film may generally be improved, or at least not degraded, by slightly titanium-rich compositions. Advantageously, precursors AX and BY of the present invention may be chosen to supply more Y ligands than X ligands to the ester elimination reaction, thus driving the elimination of X to completion. If slightly more precursor BY than precursor AX (preferably a molar ratio AX to BY of between 1.0:1.0 and 1.0:1.1 is used) is supplied in the precursor solution, it may be ensured that the ratio of A to B in the final film will not fall below 1:1, and in some cases titanium-rich films (preferably up to 5% excess titanium) may be deposited.

The present invention may also be used to form doped mixed-metal oxides, where dopant atoms (typically in a concentration less than 5% of the concentration of A atoms) are used to enhance the electrical characteristics of the oxide film. For example, lead is generally not preferred for microcircuit applications, but may be used in small amounts in a film according to the present invention. Other useful dopants include acceptor dopants such as Mn and Mg which may substitute, e.g. for Ti in a titanate film, and donor dopants such as Dy, Ho, and Er which may substitute, e.g. for Ba or Sr, in a perovskite film. Such a dopant may be added to the present invention as a third precursor and designed to participate appropriately in the ester elimination reaction, or possibly pyrolize separately on the substrate surface if its ligands do not cause a problem in film composition.

Many other compositions other than those described are believed to be useful in the present invention. For example, R substituents other than $CH_3$, such as propyl, butyl, phenyl, $CCl_3$, $CF_3$, $CH_2CF_3$, etc., may be used in a first precursor. The multidentate ligand L may be either cyclic or acyclic. The donor atoms in the multidentate ligand may be O, N, S, P, or any combination thereof. Many hydrocarbon solvents, including pyridine, ethers, amines, and alcohols, may be useful in creating a precursor mixture.

The present invention is not to be construed as limited to the particular examples described herein, as these are to be regarded as illustrative, rather than restrictive. For example, compound films having 3 or more metallic elements may be made by combining multiple precursors in an appropriate ratio (e.g. 60:40:100 molar adducts of barium and strontium formate and TPT). Intermediate compound films may be annealed in inert or reducing atmospheres. Ambient pressures from near-vacuum to much greater than 1 atmosphere may be used in the practice of the invention. A dielectric film deposited according to the present invention may have many other applications, e.g. as a gate dielectric for a field-effect transistor integrated on a semiconductor device.

What is claimed is:

1. A method of depositing a thin film on a semiconductor substrate, said method comprising:
   (a) combining first and second dehydrated precursors by a method which substantially avoids hydrolysis, thereby forming a dehydrated solution, said first precursor of the formula AX and said second precursor of the formula BY, wherein:
      (i) A is a metal selected from the group consisting of barium, strontium, calcium, bismuth, lead, and combinations thereof;
      (ii) B is a metal selected from the group consisting of titanium, niobium, zirconium, and combinations thereof,
      (iii) X represents at least one first organic ligand coordinated to A and having an empirical formula $O_2CR$, wherein R is selected from the group consisting of alkyl, aryl, substituted alkyl, substituted aryl and halogenated hydrocarbon substituents; and
      (iv) Y comprises at least one second organic ligand coordinated to B and having an empirical formula OR', wherein R' is an organic substituent;
   (b) coating said substrate with said solution, thereby forming a preliminary thin film on said substrate; and
   (c) heating said substrate to a temperature sufficient to produce an ester elimination reaction between said first and second precursors in said preliminary thin film, said reaction reacting substantially all of said first organic ligands with said second organic ligands to form a volatile ester, said reaction transforming said preliminary thin film into an intermediate compound film comprising A, B, and O on said substrate, wherein A in said intermediate compound film is provided substantially only by said first precursor.

2. The method of claim 1, further comprising annealing said intermediate compound film at a predetermined temperature, thereby vaporizing substantially all of said Y ligands remaining after said ester elimination reaction.

3. The method of claim 2, wherein said annealing step also crystallizes said intermediate compound film, thereby forming a polycrystalline film having an empirical formula $ABO_3$.

4. The method of claim 3, wherein said annealing step is carried out in an oxygen-containing atmosphere.

5. The method of claim 3, wherein said predetermined temperature is less than 500° C.

6. The method of claim 3, wherein said annealing step is performed at the same temperature as said reacting and transforming steps.

7. The method of claim 1, wherein said volatile ester has an empirical formula $R'O_2CR$.

8. The method of claim 1, wherein X further comprises a multidentate ligand L coordinated to A.

9. The method of claim 8, wherein said multidentate ligand L is cyclic.

10. The method of claim 9, wherein said cyclic multidentate ligand L is a crown ether selected from the group consisting of 18-crown-6 and 15-crown-5.

11. The method of claim 1, wherein said temperature sufficient to produce an ester elimination reaction is below the temperature necessary to thermally decompose said first precursor.

12. The method of claim 1, wherein said temperature sufficient to produce an ester elimination reaction is below the temperature necessary to thermally decompose both said first precursor and said second precursor.

13. The method of claim 1, wherein said solution further comprises a third precursor, said third precursor comprising a dopant D, said dopant D selected from the group consisting of Pb, Mn, Mg, Dy, Ho, Er, and combinations thereof, said dopant D having a molar concentration in said solution less than 5% of the molar concentration of said metal A in said mixed stable phase.

14. A method of forming a thin film of insulating material on a semiconductor substrate, said insulating material having an empirical formula $ABO_3$, where A is a divalent metal selected from the group consisting of barium, strontium, calcium, lead, and combinations thereof, where B is a metal selected from the group consisting of titanium, niobium, zirconium, and combinations thereof, said method comprising:
   (a) combining first and second dehydrated precursors with a solvent by a method which substantially avoids hydrolysis, thereby forming a dehydrated solution, said first precursor having an empirical formula $A(O_2CR)_2 \cdot L$ and said second precursor having an empirical formula $BR'_x R''_{\alpha-x}$, wherein:
      (i) R is a first organic substituent selected from the group consisting of alkyl, aryl, substituted alkyl, substituted aryl and halogenated hydrocarbon substituents;
      (ii) L is a multidentate ligand coordinated to A;
      (iii) R' is an alkoxyl organic substituent;
      (iv) R" is a third organic substituent selected from the group consisting of alkoxyls, $\beta$-diketonates, $\beta$-ketoiminates, Schiff bases, and combinations thereof; and
      (v) x has a value selected between 1 and $\alpha$, inclusive; and
   (b) coating said substrate with said solution, thereby forming a preliminary thin film on said substrate;
   (c) drying said preliminary thin film to remove substantially all of said solvent from said preliminary thin film;
   (d) heating said substrate to a temperature sufficient to produce an ester elimination reaction between said first and second precursors in said preliminary thin film, said reaction forming a volatile ester and forming an intermediate compound film comprising A, B, and O on said substrate; and
   (e) annealing said intermediate compound film, thereby converting said intermediate compound film into said film of insulating material;
   whereby said thin film of insulating material may be formed using a metal-organic precursor having carboxylate-like ligands, without intermediate formation and removal of metal carbonate and/or metal fluoride byproducts in said film.

15. The method of claim 14, wherein said first and second precursors in said solution are supplied in a molar ratio of between 1.0:1.0 and 1.0:1.1.

16. The method of claim 14, wherein said annealing step occurs simultaneously with said forming an intermediate compound film step.

17. The method of claim 14, wherein $x=2$ and $\alpha=4$.

18. The method of claim 17, wherein R' is isopropyl and R" is acetylacetonate.

19. The method of claim 14, wherein said second precursor is Ti(O"Pr)$_4$.

20. The method of claim 14, wherein said multidentate ligand L is a crown ether selected from the group consisting of 18-crown-6 and 15-crown-5.

21. A method of forming a thin film of insulating material on a semiconductor substrate, said insulating material having an empirical formula ABO$_3$, where A is a divalent metal selected from the group consisting of barium, strontium, calcium, lead, and combinations thereof, where B is a metal selected from the group consisting of titanium, niobium, zirconium, and combinations thereof, said method comprising:

(a) combining first and second dehydrated precursors by a method which substantially avoids hydrolysis, thereby forming a dehydrated liquid precursor mixture, said liquid precursor mixture comprising first and second precursors in a molar ratio of substantially 1:1, said first precursor having a formula A(O$_2$CR)$_2$.L and said second precursor having a formula BR'$_2$R"$_{a-2}$, wherein:

(i) R is a first organic substituent selected from the group consisting of alkyl, aryl, substituted alkyl, substituted aryl and halogenated hydrocarbon substituents;

(ii) L is a multidentate ligand coordinated to A;

(iii) R' is an alkoxyl organic substituent; and (iv) R" is a third organic substituent selected from the group consisting of alkoxyls, α-diketonates, α-ketoiminates, Schiff bases, and combinations thereof;

(b) coating said substrate with said liquid precursor mixture, thereby forming a preliminary thin film on said substrate;

(c) heating said substrate to a temperature sufficient to produce an ester elimination reaction between said first and second precursors in said preliminary thin film, said reaction forming a volatile ester and forming an intermediate compound film comprising A, B, and O on said substrate; and (d) annealing said intermediate compound film in an oxygen-containing atmosphere, thereby converting said intermediate compound film into said film of insulating material;

whereby said thin film of insulating material may be formed using a metal-organic precursor having carboxylate-like ligands, without intermediate formation and removal of metal carbonate and/or metal fluoride byproducts in said film.

* * * * *